United States Patent [19]

Montoya

[11] Patent Number: 5,773,987
[45] Date of Patent: Jun. 30, 1998

[54] METHOD FOR PROBING A SEMICONDUCTOR WAFER USING A MOTOR CONTROLLED SCRUB PROCESS

[75] Inventor: Thomas T. Montoya, Austin, Tex.

[73] Assignee: Motorola, Inc., Schaumburg, Ill.

[21] Appl. No.: 606,630

[22] Filed: Feb. 26, 1996

[51] Int. Cl.⁶ ..................................................... G01R 1/04
[52] U.S. Cl. ........................................... 324/757; 324/754
[58] Field of Search ..................................... 324/754, 755, 324/757, 758, 158.1, 765; 437/8; 439/482, 824; 438/14, 17; 257/48, 40

[56] References Cited

U.S. PATENT DOCUMENTS

| | | | |
|---|---|---|---|
| 3,437,929 | 4/1969 | Glenn | 324/754 |
| 3,453,545 | 7/1969 | Oates | 324/72.5 |
| 3,996,516 | 12/1976 | Luther | 324/72.5 |
| 4,758,785 | 7/1988 | Rath | 324/754 |
| 4,780,836 | 10/1988 | Miyazaki et al. | 364/551.01 |
| 5,410,259 | 4/1995 | Fujihara et al. | 324/758 |
| 5,436,571 | 7/1995 | Karasawa | 324/757 |

Primary Examiner—Vinh P. Nguyen
Attorney, Agent, or Firm—Jeffrey S. Abel; Patricia S. Goddard

[57] ABSTRACT

A process for probing a semiconductor wafer involves bringing the bond pads (63) of a semiconductor die (114) into contact with probes (122) of a probe card (120) by moving a probe chuck (110) in the Z-direction. Initial contact is made with "zero-overdrive." The probe chuck is then moved in a small amount in the Z-direction to induce a pressure in the probe. Scrubbing of the probes against the pads is then performed by moving the probe chuck in the X and Y directions. During movement in the X and Y directions, the pressured induced in the probe is released, causing the probe to begin to break through an oxide layer (62) of the bond pad. If the oxide layer is not completely broken, the movement of the probe chuck in the Z and then X & Y directions is repeated until electrical contact between the probes and the bond pads is made.

22 Claims, 5 Drawing Sheets

METHOD FOR PROBING A SEMICONDUCTOR WAFER USING A MOTOR CONTROLLED SCRUB PROCESS

CROSS-REFERENCE TO RELATED APPLICATION

The present application contains subject matter related to subject matter of a co-pending application by Thomas T. Montoya entitled, "Probe Tip, a Probe Card, a Process for Testing a Semiconductor Device and a Semiconductor Device, " Ser. No. 08/565,141, filed Nov. 30, 1995, and assigned to the assignee hereof.

FIELD OF THE INVENTION

This invention relates generally to semiconductor processing, and more particularly to a motor-controlled scrub process for probing a semiconductor wafer.

BACKGROUND OF THE INVENTION

In the integrated circuit industry, integrated circuits are mass manufactured on semiconductor wafers. The semiconductor wafer will contain tens to thousands of integrated circuits on a wafer surface. These integrated circuits are typically probed using probe card assemblies so that electrical test signals can be transmitted from testers to the integrated circuits. The probe cards contain conductive probe needles which make contact with force to conductive bond pad areas on each integrated circuit. The conductive bond pad areas are lithographically patterned metal regions, typically formed in the top most metal layer of each integrated circuit. If the bond pads are formed of a material such as aluminum, the aluminum will oxidize when exposed to the ambient atmosphere. Therefore, when contacting the bond pads with probe needles, a scrub process must be performed between the probe needles and the bond pads in order to break through any oxide on top of the bond pads and make adequate electrical contact to the underlying conductive material of the bond pad.

Figure 1:
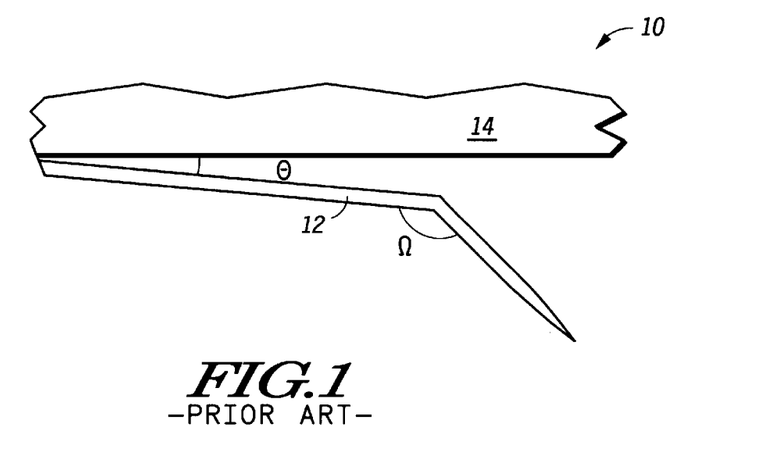
FIG. 1 illustrates, in a cross-sectional diagram, a prior art probe card assembly.

FIG. 1 illustrates in cross-section, a portion of a prior art probe card assembly 10. Probe card assembly 10 comprises a cantilever probe needle 12 and a probe printed circuit board (PCB) 14. FIG. 1 illustrates only a single probe needle 12, however, a single probe printed circuit board 14 usually serves as supporting material for tens or hundreds of individual probe needles. For purposes of understanding problems associated with the use of cantilever probes, illustration of only one probe needle is sufficient.

Figure 2:
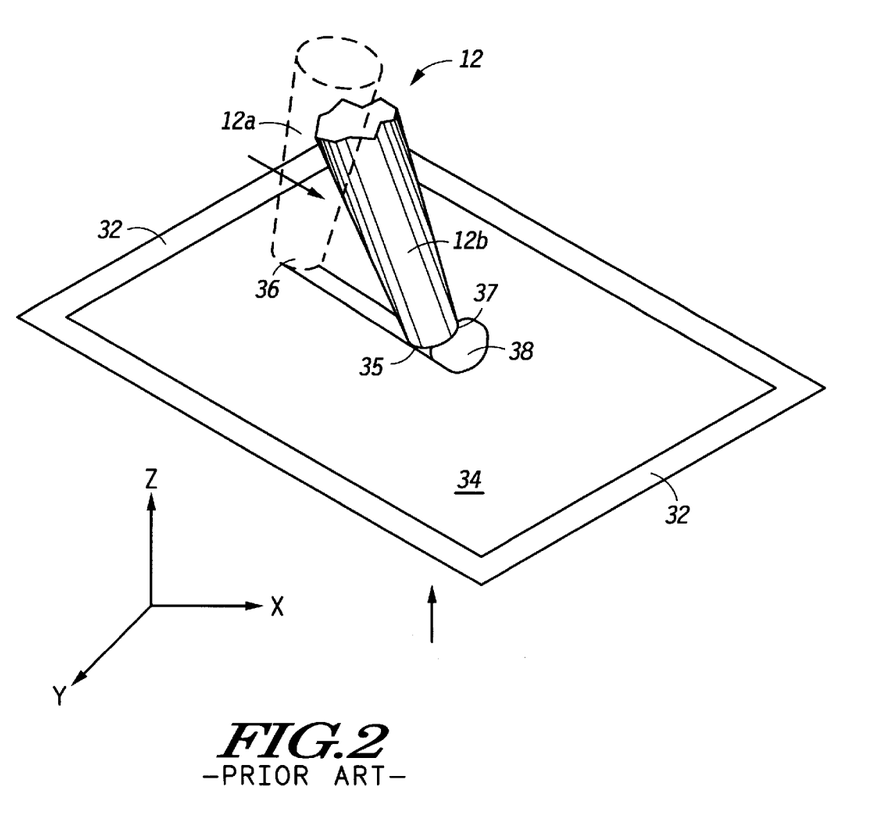
FIG. 2 illustrates, in a three dimensional perspective view, bond pad scrub damage occurring from the probe card assembly of FIG. 1.

During the probing operation and as illustrated in FIG. 2, the cantilever probe needle 12 of probe card assembly 10 from FIG. 1 is brought into contact with a bond pad 34 of a semiconductor wafer in a position 12a in a Z-direction. In position 12a, the probe needle 12 is in contact with the uppermost surface of bond pad 34, which is often a native oxide layer. Initially, the cantilever probe needle 12 will touch the oxide layer on top of bond pad 34 with virtually no pressure, which is referred to as "zero overdrive." The semiconductor wafer is then driven with greater pressure against the cantilever probe needle 12 in the Z-direction (called positive or greater than zero overdrive), causing the cantilever probe needle 12 to scratch the surface of the bond pad in an X-direction. A typical prior art overdrive distance is on the order of 3–4 mils (75 to 100 $\mu$m). The reaction of the probe needle to the vertical overdrive is illustrated in FIG. 2 as movement of cantilever probe needle 12 from position 12a to a position 12b. With a typical overdrive, the horizontal movement of the probe is about 15 $\mu$m. The X-direction movement of cantilever probe needle 12 scratches or "scrubs" the oxide layer of the bond pad to form a scrub line 36. The scrub line is a "scratch" left in the surface of the bond pad where oxide and some metal material has been scratched from a top surface of the bond pad 34. The scratch material forms a metal/oxide buildup region 38, as shown in FIG. 2. By scratching the surface and penetrating the oxide on top of the bond pad 34, electrical connection between the probe needle 12 and the bond pad 34 is achieved.

The scrubbing or scratching process described above relies on arbitrary X-axis motion of cantilever probe needle 12 and is difficult to control. While each probe needle is intended to slide in either a single uniform X direction or Y direction toward a center point of the die being tested, cantilever probe needle 12, when subjected to overdrive force can slide across the bond in any direction within a 180° range in the X-Y plane. Such wide variation in needle movement can lead to probing which is "off-pad," wherein the needle literally slides off the bond pad area. An additional problem with the significant positive overdrive and reactionary probe needle movement is that the overdrive pressure required to cause sufficient probe needle movement to break the oxide layer results in a significant scrub line 36 or significant scratch damage to the bond pad 34. Moreover, such significant overdrive pressure can even adversely damage a passivation layer 32 which is formed over the integrated circuit and surrounding bond pad 34. The significant overdrive scrub process also causes damage to the probe needles requiring frequent repairing (e.g. sanding of the tips) and/or replacement. Furthermore, when the cantilever probe needle 12 slides laterally across the surface of the bond pad 34, the cantilever probe needle 12 may not sit on the bond pad with maximal contact surface area resulting in a poor electrical contact. As the probe needle slides across the bond pad, there is a tendency for one side of the probe tip (analogous to a heel 35 of the tip) to remain in contact with the pad, while an opposing side of the probe tip is lifted (analogous to a toe 37 of the tip). Yet another problem with the reactionary overdrive scrub process is the formation of metal and oxide build-up region 38. Build-up of either oxide or metal can lead to particle defects on the wafer, and can have adverse effects on subsequent ball bonding processes used in integrated circuit packaging.

Figure 3:
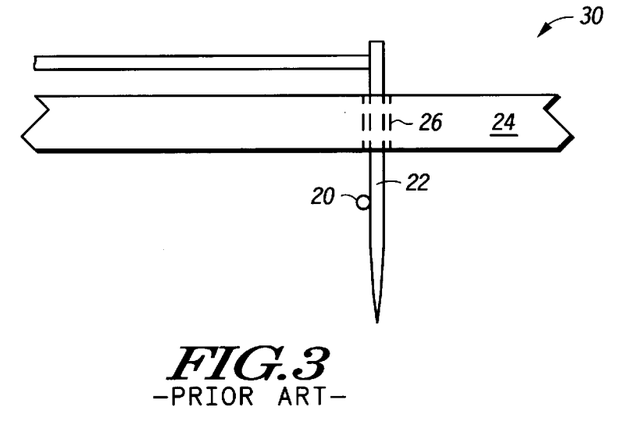
FIG. 3 illustrates, in a cross-sectional diagram, another prior art probe card assembly.

FIG. 3 illustrates another prior art vertical probe needle probe card assembly 30. Assembly 30 comprises a probe printed circuit board 24 which contains at least one vertical probe needle 22. Vertical probe needle 22 contains a mechanical scrub triggering mechanism 20. The mechanism 20 is used to drive the probe needle 22 across a surface of the bond pad in an X-direction to perform the scrubbing operation illustrated in FIG. 2. This scrubbing operation is not as uncontrolled as the scrubbing operation from cantilever probes illustrated in FIGS. 1 and 2 because the probe movement is confined by an opening 26 in probe printed circuit board 24 and is controlled by mechanism 20. Therefore, the scrub damage from vertical probe needles is significantly reduced as compared to damage induced by cantilever probe needles.

Nonetheless, use of vertical probe needles has disadvantages. One disadvantage is that the vertical probe needles are expensive to manufacture. Furthermore, the mechanical scrubbing triggering mechanism 20 is prone to mechanical failure. Therefore, the useful life of vertical probe needles is relatively short. Due to the higher cost associated with the manufacture and purchase of vertical probe needles and the fact that these vertical probe needles must be replaced more frequently than cantilever probe needles, vertical probe needles are not a cost effective scrub solution for wafer probing.

Therefore, an improved scrub process is needed in the integrated circuit art which is cost effective, reduces scrub damage, and makes effective electrical contact for integrated circuit test purposes.

Detailed Description of a Preferred Embodiment

Generally, the present invention provides a method for probing semiconductor wafers which eliminates the need for inducing a mechanical scrubbing action through reactionary movement of the probes. Using a substantial positive overdrive in the Z direction and reactionary probe movement in the X & Y directions as discussed previously, prior art mechanical scrubs relied upon a reactionary movement of the probe needles across the bond pad to break through an oxide layer on the pads to make electrical contact. However, such probe movement is difficult to control and leads to problems associated with scratches, passivation damage, and alignment tolerance across large wafers. The present invention replaces these traditional mechanical scrubs by bringing the semiconductor wafer into contact with the probes without excessive force, and moving the wafer relative to the probes while such contact is made. Movement of the probe needles is minimum. An oxide layer which is formed on the bond pads is broken by a combination of a proactive movement of the probe needles relative to the bond pads in X and Y directions. In addition, a slight Z direction overdrive (much less than the extent of overdrive in prior art processes) can be used to induce a small amount of vertical pressure in the probes, which is released during the X and Y movement, causing the probes to burrow through any native oxide layer on the bond pads. In a preferred embodiment, the proactive movement of the probe needles relative to the bond pads is achieved by moving the wafer while the probe needles are in contact with the bond pads.

These features and other advantages of the present invention will be more clearly understood from the following detailed description and in a reference to FIGS. 4–9. It is important to point out that the dimensions of objects illustrated are not necessarily drawn to scale, and that there may be other embodiments of the present invention which are not specifically illustrated.

Figure 4:
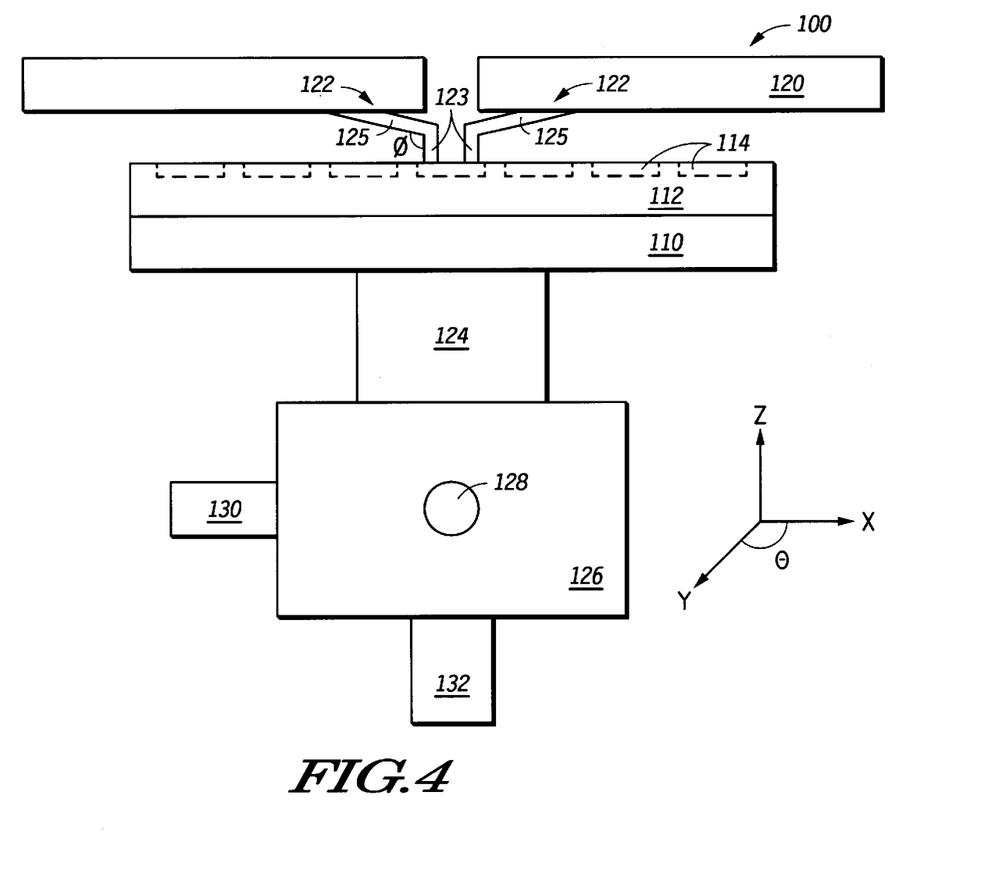
FIG. 4 illustrates, in a cross sectional view, a prober assembly for probing semiconductor wafers in accordance with the present invention.

FIG. 4 illustrates a prober 100 (also called a probe assembly) which is suitable for practicing the present invention. Prober 100 includes a probe chuck 110 upon which a semiconductor wafer 112 is mounted. Wafer 112 is maintained on chuck 110 through the use of a conventional vacuum (not illustrated). Semiconductor wafer 112 includes a plurality of semiconductor die 114, each of which requires testing in the manufacturing process. Testing of each die is performed on a tester (not illustrated). A probe card 120 (also called a probe board) acts as an interface between the tester and the semiconductor wafer. As illustrated, probe card 120 includes a probe board, typically in the form of a printed circuit board or a ceramic wiring substrate, and a plurality of probes 122 (also referred to a probe needles). Probe board includes conductive traces (not illustrated) which carry signals from the tester to the probes 122. Probes 122 are arranged in a configuration such that the probes will contact a plurality of bonding pads (not illustrated in FIG. 4) of each semiconductor die. As illustrated, probe card 120 is configured such that only one semiconductor die is tested at a time, however, it is understood that multiple semiconductor die can be simultaneously tested with an appropriately designed probe card.

Further as illustrated in FIG. 4, probes 122 include two sections, a tip section 123 and a beam section 125. In a preferred embodiment of the present invention, an angle Ø is less than 100°, and preferably close to 90°. The purpose of having perpendicular probes in practicing the invention is subsequently discussed in reference to FIGS. 6–8. Formation of angle Ø can be by bending a unitary piece of probe wire or by joining two separate probe wire pieces.

Prober 100 also includes a stage 126. Probe chuck 110 is connected to stage 126 by a stem portion 124. Stage 126 controls the movement of chuck 110, and therefore of wafer 112, by a plurality of motors. Specifically, movement of chuck 110 is controlled in the Y direction by a Y axis motor 128, in the X direction by an X axis motor 130, and in the Z direction by a Z axis motor 132. In a preferred embodiment, each of the motors illustrated is a stepper motor (servo motor) driven by electrical signals such as those known and used in the field of wafer handling and alignment.

Figure 5:
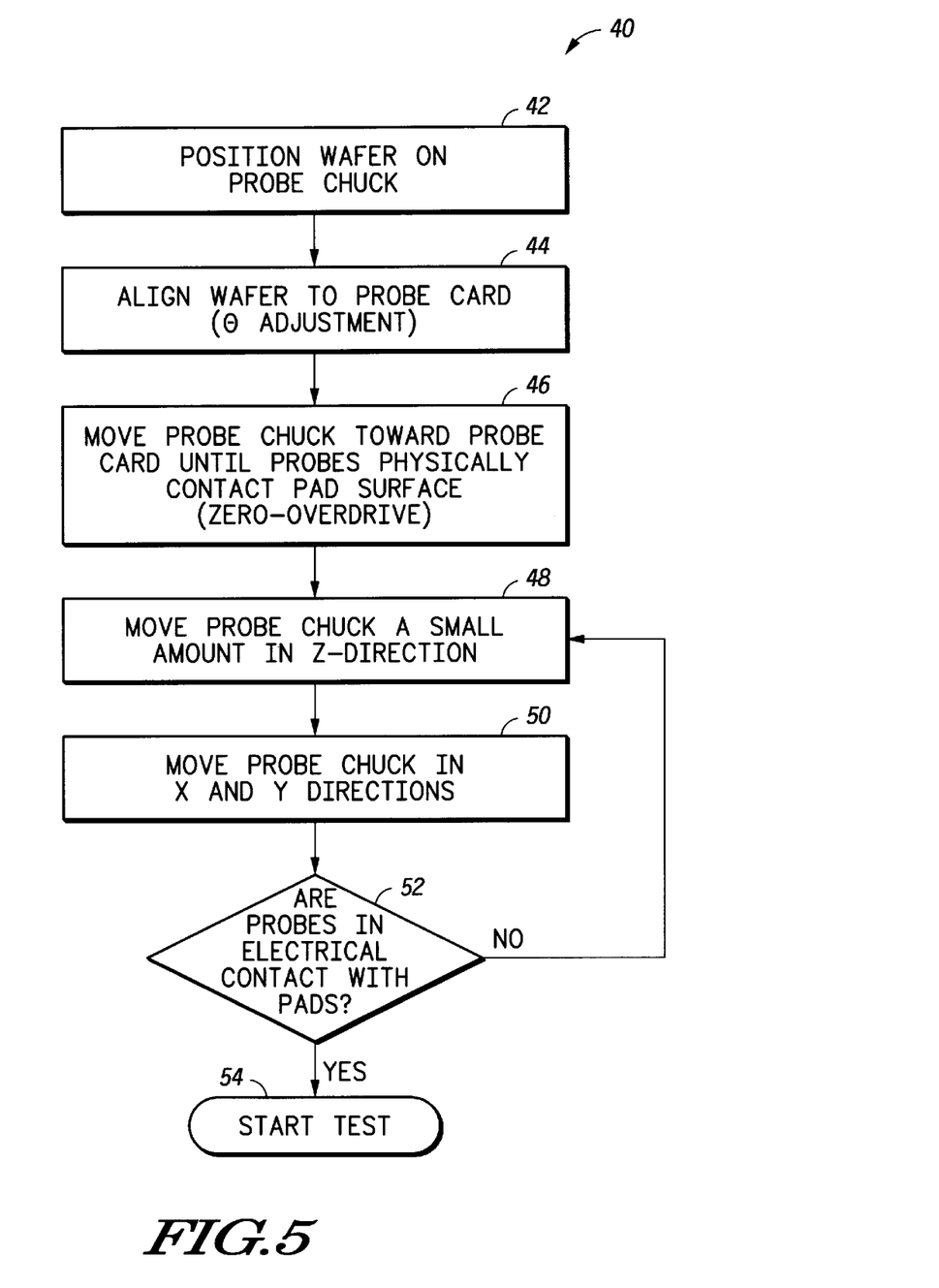
FIG. 5 illustrates, in a flowchart, a method for probing a semiconductor wafer in accordance with the present invention.

A method for practicing the present invention is illustrated in a process flow 40 of FIG. 5. In a first step 42, semiconductor wafer 112 is positioned on probe chuck 110. In a second step 44, the wafer is aligned to the probe card in the X and Y directions (also known as a θ adjustment). An alignment must be made so that the plurality of probes on the probe card will make proper contact the plurality of bond pads on the semiconductor wafer. Whether or not a θ adjustment is needed is typically determined by a video or pattern computer-implemented process. The determined adjustment, if any, is carried out by moving chuck 110 in the X and/or Y directions using the X axis motor 130 and Y axis motor 128 as needed.

After the θ adjustment is made, a third step 46 is to move the chuck (and therefore the wafer) toward the probe card in a Z axis direction until the probes make physical contact with the bond pads of the die. Movement of the chuck toward the probe card is achieved by controlling stage 126 with Z axis motor 132. This zero overdrive contact between the probes and the bond pads as used in the present invention is illustrated more clearly in reference FIG. 6.

Figure 6:
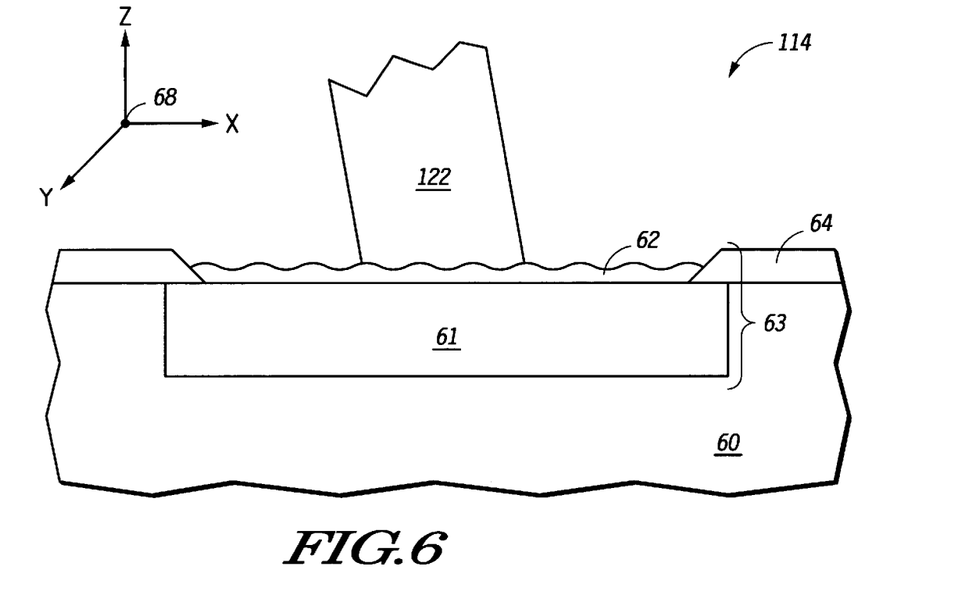
FIGS. 6–8 illustrate, in cross sectional views, a portion of a semiconductor die as a probe needle makes contact to a bond pad using the method of FIG. 5 in accordance with the present invention.

FIG. 6 is an exploded cross-sectional view of a portion of a semiconductor die 114. Die 114 includes a substrate 60 which typically will be formed of silicon or other semiconducting starting material. Various conducting and insulating layers are typically grown, deposited, and etched to form integrated circuitry on the starting substrate material. The details of integrated circuitry formation is not important for the purposes of understanding the present invention. Therefore, the starting material and integrated circuitry are collectively represented in FIG. 6 as substrate 60.

In order to electrically access the integrated circuitry of the die, a plurality of bond pads, such as a bond pad 63, are formed over the substrate. Bond pad 63 will often include two or more distinct layers. As illustrated, bond pad 63 includes a metal layer 61 and an oxide layer 62. In its most typical form, the bond pad metallization will be aluminum, which may be doped with small amounts of silicon and/or copper. However, other metals, e.g. gold and solder, can instead form the bond pad metallurgy. Following definition of the bond pads on the semiconductor die a passivation layer 64 is formed on the die to protect underlying circuitry from environmental contaminants. In order to make electrical contact to the bonding pads however, a window is created in passivation layer 64 to expose the metal portion of the bond pad. Because metal layer 61 is often in the form of aluminum, which readily oxidizes, a native oxide layer 62 will inherently form on the bond pad upon exposing the die to ambient atmosphere. Traditionally, a native oxide layer which grows on aluminum bond pads is on the order of 10–20 angstroms (0.010–0.020 microns) thick.

In reference to FIG. 6, zero overdrive of step 46 refers to the fact that probe 122 contacts bond pad 63, without necessarily contacting the metal layer of the bond pad (i.e. without making electrical contact). In the coordinate system shown in FIG. 6, the zero overdrive in the Z direction is represented as a starting point 68. As illustrated, probe 122 is in contact with oxide layer 62. For the purposes of performing third step 46, this contact is sufficient.

As is apparent from FIG. 6, probe 122 is not making electrical contact with bond pad 63 since it is contacting only oxide layer 62. To make electrical contact, probe 122 must break through oxide layer 62. However, significant horizontal movement of probe 122 caused by moving the wafer or die closer to the probe card and thereby forcing the probe to break through the oxide and travel in a horizontal direction is undesirable for reasons explained previously. Therefore, in accordance with the present invention, horizontal movement of probes 122 relative to the wafer is controlled by moving either the probe card or the chuck in the X and Y directions. In other words, the scrubbing action of the probes against the pads is a proactive movement in the X-Y plane, rather than a reactionary movement of the probes as a result of moving the wafer in a Z-direction.

As indicated in a fourth step 48 of process flow 40, after making initial contact between the probes and the bond pads, the probe chuck is moved by a small amount in the Z direction. Generally, the movement in the Z direction is much less than Z direction movement in prior art process, for example less than 10 $\mu$m as compared to 75°100 $\mu$m. Preferably, the movement in the Z direction is less the 1 $\mu$m, and more preferably movement is comparable to the thickness of any oxide layer formed on the pad (e.g. less than 100 Å (less than 0.001 $\mu$m). The purpose of moving the probe chuck by a small amount in a Z direction is to induce a slight pressure on the probes.

Figure 7:
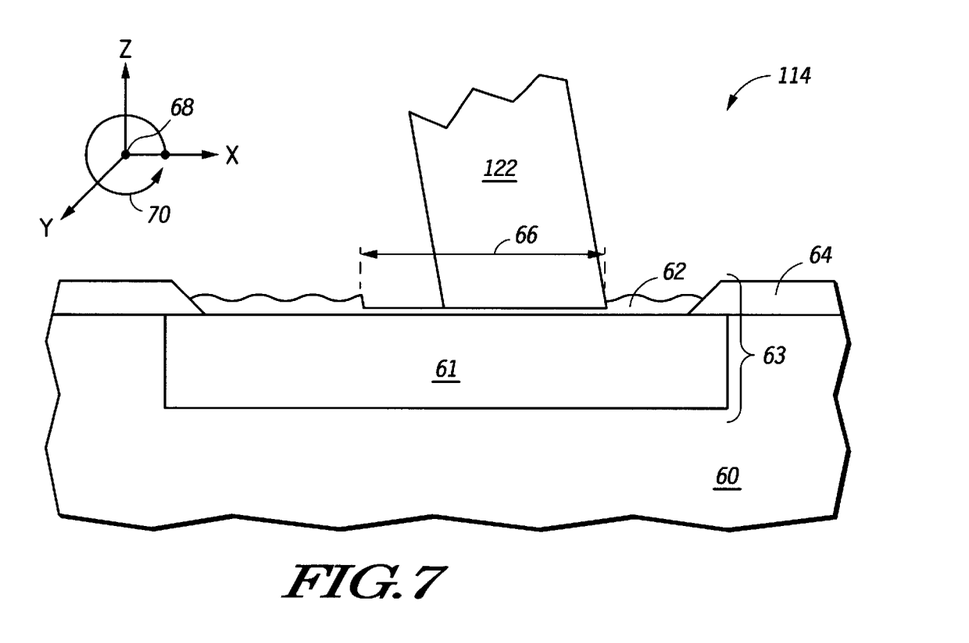

After the slight pressure is induced on the probes, a fourth step in process flow 40 is to move the probes and the bond pads relative to one another in the X and Y directions. In a preferred embodiment, the X and Y relative movement is achieved by moving the probe chuck in the X and Y directions. Alternatively, the probe card can instead be moved. Movement in the X and Y directions is preferably a circular movement or rotation. For example, as illustrated in FIG. 7, probe 122 remains fixed in location as compared to its position in third step 46 and fourth step 48 (as illustrated in FIG. 6). While probe 122 remains stationary, the probe chuck, and therefore semiconductor die 114 moves in an X and Y direction. As indicated in the coordinate system of FIG. 7, the preferred movement of the die is in a first rotation 70. To achieve rotation 70 or a comparable movement, X axis motor 130 and Y axis motor 128 are used to step chuck 110. If using stepper motors, the movement is done alternately in the X and Y directions.

As illustrated in the cross-sectional view of FIG. 7, movement of die 114 causes probe 122 to create a rotation window 66 in oxide layer 62. The window which is created in the oxide layer is due in part to the movement of the chuck in the X and Y direction, but is also due to a release of the slight pressure which was induced on the probes in step 48. Initially, the pressure applied to the probes in step 48 was absorbed by the probes. But in moving the die in the X and Y directions, the probes can relieve the induced pressure by penetrating deeper in the bond pad. Because the induced pressure is slight, penetration onto the bond pad does not create significant damage and movement of the probe in the X and Y direction is very restricted.

Figure 8:
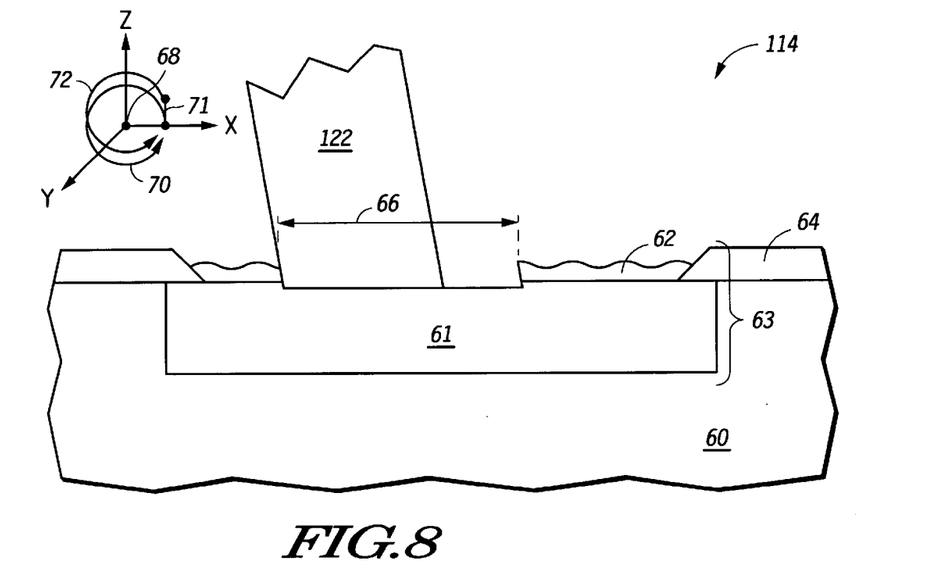

After moving the die in the X and Y directions in accordance with a fifth step 50, probe 122 may or may not be contacting metal layer 61, depending on the oxide layer thickness and the amount of movement in the Z direction. For example, as illustrated in FIG. 7, probe 122 is not yet in contact with metal layer 61. Only a portion of oxide layer 62 within rotation window 66 has been removed. Accordingly, electrical contact to the bond pad has not yet been made. In accordance with a decision step 52 of process flow 40, if after moving the probe chuck in the X and Y directions in step 50 probes 122 are not yet in electrical contact with the bond pads, then fourth step 48 and fifth step 50 are repeated until electrical contact is made. In reference to FIG. 7, electrical contact between probe 122 and bond pad 63 is not yet made, therefore the probe chuck is moved in the Z direction again by a small amount in accordance with step 48, followed by movement of the probe chuck in the X and Y direction in accordance with step 50. In reference to the coordinate system illustrated in FIG. 8, the incremental movement in the Z direction is represented by a vertical movement 71. The subsequent movement of the chuck in the X and Y directions in accordance with step 50 is represented by a second rotation 72. After performing the second rotation, probe 122 will have removed more of oxide layer 62 within rotation window 66, and may now be in contact with metal layer 61, as illustrated in FIG. 8. At this point, electrical contact between the probes and the bond pad is made and testing of the semiconductor device can begin in accordance with a sixth step 54. After testing one die or group of die, the wafer is moved away from the probe card, and is repositioned to test a different die or group of die on the wafer following process flow 40. Process flow 40 is repeated until all die on the wafer have been tested.

As mentioned earlier, in a preferred embodiment probes 122 have an angle between the tip and beam sections which is less than 100°, and which is preferably close to 90°. Such perpendicular probes provide more stability and control of probe movement during step 50. As a result the a planar probe tip contacting surface remains parallel to the surface of bond pad so that a maximum contact area is maintained during the entire scrub, as illustrated in FIGS. 7 and 8.

Figure 9:
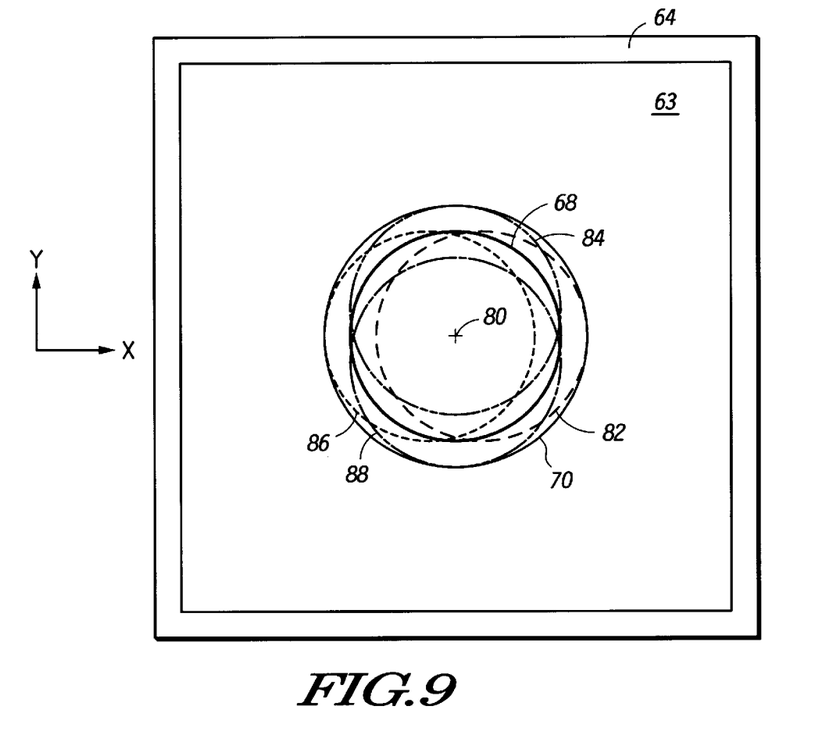
FIG. 9 illustrates, in a top perspective view, the X-axis & Y-axis movement of a probe relative to a bond pad in accordance with the present invention.

FIG. 9 illustrates a top down view of bond pad 63 and the location of probe 122 relative to the bond pad throughout the scrubbing operation. As previously described and illustrated in FIGS. 6–8, the relative movement of the bond pad and probe was achieved by moving the die and keeping the probe stationary. FIG. 9 illustrates an alternative embodiment where the probe is moved and the die is held stationary. Initially, probe 122 is brought into contact with the bond pad at a starting point 68, which is preferably as close to a center 80 of the bond pad as possible. Starting point 68 is the position of probe 122 on bond pad 63 during both third step 46 and fourth step 48 of the process flow 40. During these steps, only movement of the die in the Z direction is made. The position of the probe needle relative to the probe pad does not change. In fifth step 50, the movement of the probe needle relative to the pad changes in the X and Y directions in a first rotation 70. Movement during the first rotation 70 as previously shown in reference to FIGS. 7 and 8, is illustrated by first rotation 70 in FIG. 9. In using a stepper motor, a number of individual steps or increments are needed to achieve a full rotation. As illustrated in FIG. 9, the position of probe 122 is shown at four different stages of the rotation, specifically at a first position 82, a second position 84, a third position 86, and a fourth position 88.

As is apparent in FIG. 9, this maximum movement in the X and Y directions is much less than the movement of prior art probe needles which relied upon mechanical scrubbing action. In prior art processes, the mechanical movement of a probe needle in either the X or Y direction was in reaction to a Z axis movement of the wafer, and could be greater than 25 $\mu$m. In accordance with the present invention, the maximum total movement of the probe in either the X and Y direction is equal to the diameter of the probe being used. In reference to FIG. 9, if probe 122 has a diameter (D) of 1 mil (25.4 $\mu$m), a suitable movement (M) of ±0.0002 mil (0.005 $\mu$m) in either direction, thus the total movement is equal to 0.004 mil (0.01 $\mu$m). A maximum M for probe 122 of FIG. 9 would be one-half the diameter, for a total movement of the probe in either the X and Y direction equal to the probe diameter. In preferred embodiments of the present invention, each probe has a diameter of less than 20 $\mu$m.

The foregoing description and illustrations contained herein demonstrate many of the advantages associated with the present invention. In particular, it has been revealed that the X and Y direction movement of the of the probes relative to the bond pads can be tightly controlled by proactively moving either the wafer or the probe card in the X and Y directions, rather than relying upon the probes to react to a movement of the wafer in a Z direction. Furthermore, because the extent of probe movement in the X and Y directions is minimal in practicing the invention, smaller diameter probes across the entire probe length and shorter probe lengths can be used than in conventional probing methods which utilize a mechanical scrub. Shorter length probes are preferred for elevated temperature probing. Another benefit of using the invention is that the pad pitch (i.e. the center to center spacing of adjacent bond pads) can be made small (<50 $\mu$m) since probe movement is strictly confined and the probe diameter can be made small. A further advantage of restricting probe movement in the X and Y directions is that the entire tip of the probe remains in full contact with the bond pad during probing. The probes do not experience the "toe-up" problem as explained in reference to prior art probing in FIG. 2.

Thus it is apparent that there has been provided, in accordance with the invention, a method for probing a semiconductor wafer using a motor-controlled scrub process that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention can be used for probing bumped wafers. Therefore, it is intended that this invention encompass all such variations and modifications as fall within the scope of the appended claims.

I claim:

1. A method for probing a semiconductor wafer comprising the steps of:

providing a semiconductor die having a surface and a plurality of pads;

providing a prober having a probe chuck;

providing a probe card having a plurality of probes;

placing the semiconductor die on the probe chuck;

moving the probe chuck in a vertical direction toward the probe card until physical contact is made between the plurality of probes and the plurality of pads; and scrubbing the plurality of pads with the plurality of probes, wherein the step of scrubbing comprises:

while the plurality of probes is in physical contact with the plurality of pads, moving the probe chuck in a vertical direction by an amount less than 10 $\mu$m;

while the plurality of probes is in physical contact with the plurality of pads, rotating the probe chuck in a horizontal plane by motor control while maintaining the probe card stationary, without moving the probe chuck away from the probe card; and if the plurality of probes is not in electrical contact with the plurality of pads, then repeating the step of moving the probe chuck in a vertical direction and the step of rotating the probe chuck in a horizontal plane until the plurality of probes is in electrical contact with the plurality of pads.

2. The method of claim 1 wherein the step of moving the probe chuck in the vertical direction comprises moving the probe chuck by an amount less than 1 $\mu$m.

3. The method of claim 1 wherein the step of providing a probe card comprises providing a probe card wherein each probe of the plurality of probes has a diameter of less than 20 $\mu$m.

4. The method of claim 1 wherein the step of providing a probe card comprises providing a probe card wherein each probe of the plurality of probes has a beam section and a tip section, and wherein an angle between the beam section and the tip section is less than 100°.

5. The method of claim 1 wherein the step of providing a probe card comprises providing a probe card wherein each probe of the plurality of probes has a planar tip, and wherein the planar tip of each probe remains parallel to the surface of the semiconductor die during the step of scrubbing.

6. The method of claim 1 wherein the step of rotating comprises moving the probe chuck in a horizontal direction by an amount not greater than a diameter of each probe of the plurality of probes.

7. A method for probing a semiconductor wafer comprising the steps of:

(a) providing a semiconductor wafer having a top surface, the semiconductor wafer having a plurality of bond pads located on the top surface of the semiconductor wafer, the plurality of bond pads comprising a conductive material and an overlying dielectric layer;

(b) placing the semiconductor wafer onto a probe chuck within a prober assembly, the prober assembly comprising a probe board having a plurality of probe needles, wherein the step of placing the semiconductor wafer onto the probe chuck defines an x-axis parallel to the top surface of the semiconductor wafer, a y-axis parallel to the top surface of the semiconductor wafer and perpendicular to the x-axis, and a z-axis perpendicular to both the x-axis and the y-axis;

(c) moving the probe chuck in a direction of the z-axis to physically contact the plurality of probe needles to the overlying dielectric layer; and (d) using motor control to move the probe chuck with respect to the probe board in a direction of the x-axis to scrub a portion of the overlying dielectric layer from the plurality of bond pads while maintaining the probe card stationary, without moving the probe chuck away from the probe board.

8. The method of claim 7 further comprising the steps of:
(e) further moving the probe chuck in the direction of the z-axis to move the plurality of probe needles closer to the conductive material of the plurality of bond pads; and
(f) repeating step (d).

9. The method of claim 7 further comprising the step of:
(e) repeating step (d) while periodically moving the probe chuck closer to the probe board in the direction of the z-axis and without moving the probe chuck away from the probe board.

10. The method of claim 9 wherein periodic movement of the probe chuck in the direction of the z-axis occurs in increments of less than 1 $\mu$m at a time.

11. The method of claim 7 wherein the step (d) comprises:
moving the probe chuck with respect to the probe board in both the direction of the x-axis and a direction of the y-axis to scrub a portion of the overlying dielectric layer from the plurality of bond pads.

12. The method of claim 11 wherein the step (d) comprises:
moving the probe chuck with respect to the probe board in the direction of the x-axis by transmitting electrical signals to an x-axis motor and moving the probe chuck with respect to the probe board in the direction of the y-axis by transmitting electrical signals to a y-axis motor.

13. The method of claim 7 wherein the step (d) comprises:
moving the probe chuck with respect to the probe board in all of the direction of the x-axis, a direction of the y-axis, and the direction of the z-axis to scrub a portion of the overlying dielectric layer from the plurality of bond pads.

14. The method of claim 13 wherein the step (d) comprises:
moving the probe chuck with respect to the probe board in the direction of the x-axis by transmitting electrical signals to an x-axis motor, moving the probe chuck with respect to the probe board in the direction of the y-axis by transmitting electrical signals to a y-axis motor, and moving the probe chuck with respect to the probe board in the direction of the z-axis by transmitting electrical signals to a z-axis motor.

15. The method of claim 7 further comprising the steps of:
(e) using the step (d) to provide electrical connection between the plurality of probe needles and the plurality of bond pads to allow for testing of at least one semiconductor die on the semiconductor wafer;
(f) moving the probe chuck with respect to the probe board to position the plurality of probe needles over a new selected semiconductor die on the semiconductor wafer which is different from the at least one semiconductor die in step (e); and
(g) repeating steps (c) and (d) for the new selected semiconductor die.

16. The method of claim 7 wherein the step (d) further comprises:
moving the probe chuck with respect to the probe board in both the direction of the x-axis and a direction of the y-axis to scrub a portion of the overlying dielectric layer from the plurality of bond pads using a substantially circular rotation in a plane defined by the x-axis and the y-axis.

17. The method of claim 7 wherein the step b) comprises placing the semiconductor wafer within the prober assembly, and wherein each probe needle of the plurality of probe needles has a tip diameter of less than 20 $\mu$m.

18. The method of claim 7 wherein the step (d) further comprises:
periodically moving the probe chuck closer to the probe board in the direction of the z-axis wherein a total distance traveled in the direction of the z-axis from when the overlying dielectric layer is physically contacted by the plurality of probe needles to when the plurality of probe needles make electrical contact to the conductive material of the plurality of bond pads is less than 1 $\mu$m.

19. The method of claim 7, wherein each probe needle of the plurality of probe needles has a planar tip.

20. A method for probing a semiconductor wafer comprising the steps of:
placing a semiconductor wafer having a top surface onto a probe chuck;
bringing the semiconductor wafer into contact with a plurality of probe needles, each probe needle in the plurality of probe needles having a tip diameter of less than 20 $\mu$m and extending from a probe card;
moving the semiconductor wafer horizontally while the plurality of probe needles is in contact with the semiconductor wafer by motor control while maintaining the probe card stationary, without moving the semiconductor wafer vertically away from the plurality of probe needles; and
testing at least one integrated circuit on the semiconductor wafer by transmitting electrical signals through the plurality of probe needles to the at least one integrated circuit.

21. The method of claim 20 wherein the step of bringing comprises wherein the step of bringing comprises bringing the semiconductor wafer into contact with the plurality of probe needles, wherein each probe needle of the plurality of probe needles has a tip portion and a stem portion, and wherein an angle between the tip portion and the stem portion is less than 100°.

22. The method of claim 20, wherein each probe needle of the plurality of probe needles has a planar tip.

* * * * *